United States Patent [19]

Schick

[11] 4,342,925
[45] Aug. 3, 1982

[54] CIRCUIT ARRANGEMENT FOR INTERRUPTION-FREE VOLTAGE SWITCHING

[75] Inventor: Ludwig Schick, Erlangen, Fed. Rep. of Germany

[73] Assignee: Siemens Aktiengesellschaft, Munich, Fed. Rep. of Germany

[21] Appl. No.: 164,572

[22] Filed: Jun. 30, 1980

[30] Foreign Application Priority Data

Jul. 20, 1979 [DE] Fed. Rep. of Germany ....... 2929515

[51] Int. Cl.³ .......................................... H03K 17/00
[52] U.S. Cl. .................................. 307/270; 307/255; 307/242
[58] Field of Search ............... 307/255, 270, 262, 210, 307/242, 244

[56] References Cited

U.S. PATENT DOCUMENTS 3,655,997  4/1972  O'Daniel et al. .................. 307/270
3,922,570  11/1975  Eguchi et al. ...................... 307/270

Primary Examiner—Stanley D. Miller, Jr.
Assistant Examiner—B. P. Davis
Attorney, Agent, or Firm—Kenyon & Kenyon

[57] ABSTRACT

A circuit arrangement for interruptionless switching to the higher of two feed voltages in a buffered current supply. Each of the feed voltages is applied to the base of a driving transistor, via a diode, and to the emitter of a complementary switching transistor. The emitters of both driving transistors are connected to reference potential via a common resistor. The collector of each driving transistor is connected to the base of the respective switching transistor and the collectors of both switching transistors are connected to the output terminal. Switching to the higher of the two applied voltages is automatic and instantaneous.

2 Claims, 1 Drawing Figure

CIRCUIT ARRANGEMENT FOR INTERRUPTION-FREE VOLTAGE SWITCHING

BACKGROUND OF THE INVENTION

This invention relates to a circuit arrangement for interruption-free switching of a voltage to an output terminal, in which feed voltages are supplied to two input terminals and in which it is intended to switch to the higher of the two feed voltages.

Such switches are needed, for example, when the supply voltage of C-MOS memories must be switched from AC to battery operation or vice versa. In present day commercial devices, relay circuits are used for this purpose. These have a certain sluggishness, however, and switching does not occur without interruption of the supplied voltage. In addition, these relay circuits require a supplementary drive circuit. Known also are switches using diodes whose cathodes or anodes are connected to one another and to an output terminal. Because of the diode threshold voltage of about 0.7 V, these switching systems, even at small currents, necessarily involve a voltage drop which is greater than the value which is permissible, for example, in the current supply of integrated semiconductor components, such as C-MOS memories.

It is an object of this invention to provide a circuit arrangement meeting the above described need in a simple manner.

SUMMARY OF THE INVENTION

According to the present invention, this problem is solved in a circuit having an input terminal, for each voltage being switched, which is coupled to the base of an associated driving transistor. The emitters of both driving transistors are connected to one terminal of a resistor, the other terminal of which is connected to reference voltage. The collector of each driving transistor is connected to the base of a complementary switching transistor and the collectors of both switching transistors are connected to the output terminal. The emitter of each switching transistor is connected to the input terminal to which the base of the associated driving transistor is connected.

To compensate for voltage drops occurring between the driving transistors and the switching transistors it is advantageous to insert a diode between each voltage input terminal and the base of the associated driving transistor.

In the switching circuit of the invention, only the driving transistor to whose base the higher of the two feed voltages is supplied becomes conducting. Thereby the respective switching transistor is switched on and the higher of the feed voltages is applied to the output terminal. Switching takes place without interruption and practically without delay. Besides, the circuit utilizes the low saturation voltage $U_{CEsat}$ of the switching transistors, which, at collector currents up to about 0.1A, is $\leq 0.25$ V. With these small voltage drops, requirements for the supply voltages of integrated semiconductor components, e.g. C-MOS memories, are completely met.

The switching system of the present invention has been described herein utilizing npn transistors as driving transistors. Naturally the circuit can be constructed in an equivalent manner with pnp transistors as driving transistors.

DETAILED DESCRIPTION OF THE INVENTION

Figure 1:
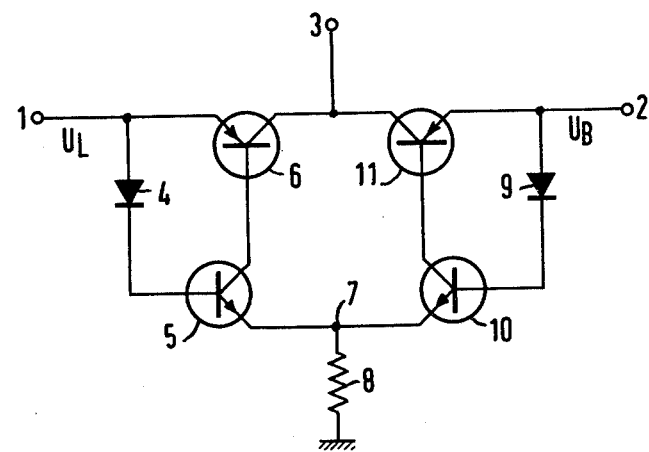
FIG. 1 is a schematic diagram of a circuit embodying the teachings of the invention.

FIG. 1 shows a switching system in which the supply voltage of C-MOS memories can be switched from AC to battery operation and vice versa. In a buffered current supply of this type for C-MOS memories, the following conditions must be fulfilled: During switching, the voltage must not drop below 2.5 V and, in AC operation, the supply voltage may, at most, be 0.3 V below the logic supply voltage derived from the line voltage.

In FIG. 1, the logic supply voltage $U_L$ derived from the AC line voltage is applied at the input terminal 1. The input terminal 2 is connected to a battery and thus the battery voltage $U_B$ is available there. The after-connected C-MOS semiconductor components are supplied via the output terminal 3.

Input terminal 1 is connected through a diode 4 to the base of an npn driving transistor 5 and directly to the emitter of a pnp switching transistor 6 complementary to the driving transistor. The emitter of driving transistor 5 is connected to the connecting terminal 7 of a resistor 8. The other terminal of resistor 8 is connected to reference voltage (grounded). The base of switching transistor 6 is driven through the collector of driving transistor 5, and the collector of switching transistor 6 is connected to output terminal 3. Let it be emphasized again at this point that driving transistor 5 may, in the alternative, be a pnp transistor and switching transistor 6, accordingly, an npn transistor.

Analogously, the input terminal 2 is connected, via a diode 9, to the base of an npn driving transistor 10, whose emitter is connected to connecting point 7 of resistor 8 and through whose collector the base of pnp switching transistor 11 is driven. The emitter of transistor 11 is connected to input terminal 2 and the collector of transistor 11 is connected to output terminal 3.

It may be assumed that the base-emitter voltages of driving transistors 5 and 10 as well as the forward voltages of diodes 4 and 9 are approximately equal. Since both driving transistors 5 and 10 are referred to the same potential via resistor 8, the base-emitter paths of driving transistors 5 and 10 act as limit value indicators to determine which of the feed voltages $U_L$ and $U_B$ is higher. If it is assumed that the voltage $U_L$ is higher, then the voltage drop across resistor 8 is determined exclusively by the current through diode 4 and the base-emitter path of driving transistor 5. Driving transistor 10 is cut off, since no current can flow from the lower battery voltage $U_B$ against the higher voltage appearing across resistor 8. Also, since only transistor 5 is conducting, only switching transistor 6 is driven, making voltage $U_L$ available at output terminal 3. If voltage $U_L$ falls below the value of the battery voltage $U_B$, the voltage drop across resistor 8 will be determined by the current flowing through diode 9 and the base-emitter path of driving transistor 10. Transistors 5 and 6 therefore cut off instantly, transistor 11 conducts, and the battery voltage $U_B$ is applied to output terminal 3 without delay.

At small currents, as required for the current supply of semiconductor components in C-MOS technology, the saturation voltage $U_{CEsat}$ of switching transistors 6 and 11 is very low. Up to a collector current of about 0.1 A, the saturation voltage is less than 0.25 V. Thus the second of the above-mentioned conditions is also fulfilled; e.g. the voltage available at output terminal 3 during AC operation is no more than 0.3 V less than the logic supply voltage $U_L$.

What is claimed is:

1. In a circuit for interruption-free switching between feed voltages, the circuit having two input terminals to each of which a feed voltage may be connected and an output terminal to which the higher of the two feed voltages is to be connected, the improvement comprising:
  a driving transistor for each input terminal, each driving transistor having a base, an emitter, and a collector, the base of each transistor being coupled to one input terminal,
  a resistor having a terminal to which the emitters of both driving transistors are connected and a terminal adapted to be connected to a reference potential,
  a complementary switching transistor for each driving transistor, each switching transistor having a base, an emitter, and a collector, the base of each switching transistor being connected to the collector of the associated driving transistor, the emitter of each switching transistor being connected to the input terminal to which the base of the associated driving transistor is connected, and
  an output terminal to which the collectors of both switching transistors are connected.

2. In a circuit arrangement in accordance with claim 1, the further improvement comprising:
  a diode connected between each input terminal and the base of the associated driving transistor.

* * * * *